May 20, 1969 B. TOPAS ET AL 3,445,301

CONTROLLED RECTIFIER HAVING SHUNTED EMITTER FORMED
BY A NICKEL LAYER UNDERNEATH AN ALUMINUM LAYER
Original Filed April 15, 1965

INVENTORS
BENJAMIN TOPAS
HAROLD WEINSTEIN
BY
OSTROLENK, FABER, GERB & SOFFEN
ATTORNEYS

United States Patent Office 3,445,301
Patented May 20, 1969

3,445,301

CONTROLLED RECTIFIER HAVING SHUNTED EMITTER FORMED BY A NICKEL LAYER UNDERNEATH AN ALUMINUM LAYER

Benjamin Topas, Santa Monica, and Harold Weinstein, Van Nuys, Calif., assignors to International Rectifier Corporation, El Segundo, Calif., a corporation of California Original application Apr. 15, 1965, Ser. No. 448,398, now Patent No. 3,297,921. Divided and this application Nov. 1, 1966, Ser. No. 591,283
Int. Cl. H01l 7/46, 11/10
U.S. Cl. 148—177 2 Claims

ABSTRACT OF THE DISCLOSURE

A process for forming a shunted emitter for a controlled rectifier in which a thin nickel layer is interposed between a shunting aluminum strip on the upper surface of a semiconductor wafer which contains two opposite conductivity regions. The nickel layer permits a good ohmic contact to both regions and prevents the formation of a regrowth region in the N-type conductivity surface region.

This invention relates to controlled rectifiers, and more specifically relates to a novel shunted emitter construction for a controlled rectifier wherein a thin nickel layer is interposed between an aluminum emitter shunt and the surface of the wafer. This is a divisional application of our copending application Ser. No. 448,398, filed Apr. 15, 1965, in the name of Topas et al., entitled, "Controlled Rectifier Having Shunted Emitter Formed by a Nickel Layer Underneath an Aluminum Layer," and assigned to the assignee of the present invention, now U.S. Patent 3,297,921.

In order to improve the *dv/dt* of a controlled rectifier, it is possible to place an aluminum shunting strip over the gate cathode junction.

We have found that when an aluminum strip is used in this manner, it causes a P-type regrowth region on the N-type cathode surface material, thus forming a rectifier barrier which affects the operation of the device and increases the forward voltage drop of the device.

The principle of the present invention is to provide a novel structure and method which retains an aluminum shunting strip for the gate cathode junction, but interposes a thin nickel barrier between the shunting strip and the wafer surface. This thin nickel barrier has been found to prevent the formation of a P-type regrowth region in the N-type material of the wafer, while permitting the formation of a suitable ohmic contact region on the P-type region of the wafer surface. Thus, the invention prevents the formation of an additional rectifier barrier, thereby eliminating this cause of increased forward voltage drop in the main power circuit of the device.

Accordingly, a primary object of this invention is to improve the *dv/dt* of a controlled rectifier without increasing the forward voltage drop of the device.

Yet another object of this invention is to permit the use of an aluminum shunting strip over the gate cathode junction of a controlled rectifier without forming an additional rectifier barrier in the N-type region of the wafer surface.

Yet another object of this invention is to provide a molecularly thin nickel layer over the full wafer surface of a controlled rectifier and to deposit thereon an aluminum shunting strip which shunts the gate cathode junction.

These and other objects of this invention will become apparent from the following description when taken in connection with the drawings, in which.

Figure 1:
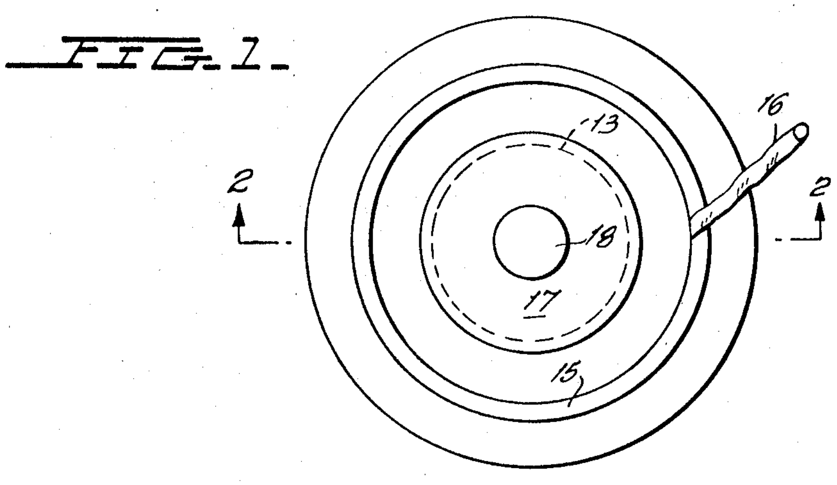
FIGURE 1 is a top view of a device using an aluminum strip for shunting the gate cathode junction.
Figure 2:
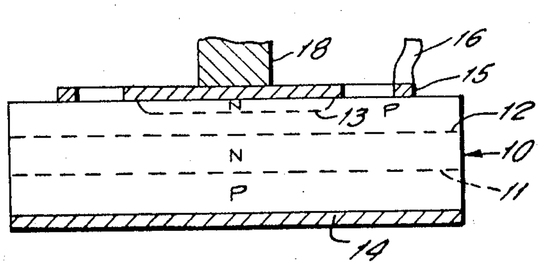
FIGURE 2 is a cross-sectional view of FIGURE 1 taken across the lines 2—2 in FIGURE 1.
Figure 3:
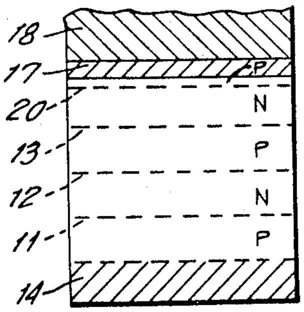
FIGURE 3 is an enlarged view of the upper N-type region of FIGURE 1, and illustrates the manner in which an additional rectifier barrier is formed in the N-type region which will decrease the forward voltage drop of the device.

Referring first to FIGURES 1, 2 and 3, we have illustrated therein a typical controlled rectifier arrangement which can be made in accordance with well-known techniques. Thus, the wafer 10 may be a single crystal semiconductor wafer of, for example, silicon which has therein three junctions 11, 12 and 13 between the four layers which are of the P-N-P-N conductivity types, respectively.

The bottom of the wafer is then provided with an anode electrode 14 which could, for example, be a molybdenum disk, while the upper surface has an electrode ring 15 which serves as the gate electrode and is connected to a gate lead 16.

A thin aluminum strip 17 is then alloyed to the upper surface of the wafer and extends across the planar edges of junction 13 so that a shunted emitter arrangement is formed in order to improve the *dv/dt* of the device.

The main cathode lead 18 is then connected to the aluminum region 17. Note that all dimensions have been greatly exaggerated in the drawings for purposes of clarity. In actuality, the alloyed strip 17 is an extremely thin strip of the order of ½ mil in thickness, and its lower surface defines an aluminum silicon alloy.

It has been found that when an aluminum emitter strip is used in this manner, a regrowth region will occur in the N-type region above junction 13, as best shown in FIGURE 3, wherein this regrowth region is of the P-type and defines a rectifying barrier 20. This rectifier barrier 20 will, of course, increase the forward voltage drop in the main power circuit of the device which is from anode 14 to cathode 17.

Figure 4:
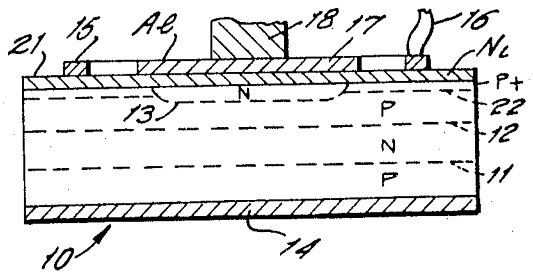
FIGURE 4 is a cross-sectional view similar to FIGURE 2 which illustrates the novel use of a nickel layer interposed between the wafer surface and the aluminum shunting strip.

The principles of the present invention is to place a thin nickel layer across the upper surface of the wafer prior to placing the aluminum shunting strip 17 on the surface. Thus, as shown in FIGURE 4 which is identical to FIGURES 1, 2 and 3 with the exception of a nickel layer 21 atop the surface of wafer 10, the aluminum layer 17 is placed immediately atop the nickel layer 21.

More particularly, and in accordance with the invention, after the formation of the junctions in wafer 10, nickel layer 21 which is as thin as possible is applied over the complete surface of the wafer. For example, nickel layer 21 could have a thickness of the order of $5.0 \times 10^{-6}$ inches. This could be laid down over the wafer surface by plating or by evaporation techniques.

Thereafter, the nickel plating is sintered or alloyed at a temperature of the order of 790° C. for 1 hour to form a nickel silicon solution at the upper surface of the wafer. Note that at the same time, the molybdenum disk 14 can be secured to the bottom of the wafer. Thereafter, the aluminum sheet 17 is applied to the upper silicon nickel surface of the wafer, and is alloyed thereto as by heating the assemblage at 760° C. for 15 minutes.

It has been found that during this alloy operation, the nickel layer will prevent the formation of a P-type regrowth region in the N-type region above the junction 13, although it permits the formation of a suitable ohmic contact region above junction 12. Thus, a P+ region will be formed above the dotted line 22 in FIGURE 4. That is to say, the nickel will not influence the effect of aluminum atoms on the P-type surface while it does prevent a conversion to P-type of the N-type surface. Note that the nickel layer need not extend over the P-type layer portion of the surface of wafer 10.

Thereafter, the complete device may be etched and operated upon in any other desired manner, and the electrode leads such as leads 16 and 18 may be applied thereto.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. The method of connecting an aluminum shunting strip across the surface of a monocrystalline silicon wafer which has both P-type and N-type conductivity regions extending to said surface without creating a P-type regrowth region on the N-type region at said surface; said method comprising the steps of:

a. depositing a layer of nickel over the full surface of said silicon wafer to a thickness of the order of $5.0 \times 10^{-6}$ inches;

b. heating said wafer to alloy said layer of nickel with the silicon at the upper surface of said wafer;

c. placing an aluminum sheet on top of said alloyed nickel layer; and d. heating said wafer to alloy said aluminum sheet into said nickel alloy, whereby said aluminum sheet will be connected across both of said P- and N-type conductivity regions and whereby said aluminum sheet in the vicinity of said P-type region will convert the surface thereof to a P+ conductivity type while said nickel layer prevents the conversion of said N-type surface region to a P-type regrowth region.

2. The method of claim 1 wherein said layer of nickel is alloyed to said silicon surface by heating said wafer at a temperature of about 790° C. for about 1 hour, and wherein said aluminum sheet is alloyed to said nickel alloy by heating said wafer at a temperature of about 760° C. for about 15 minutes.

References Cited

UNITED STATES PATENTS

| | | | |
|---|---|---|---|
| 3,268,782 | 8/1966 | Weinstein | 317—235 |
| 3,169,304 | 2/1965 | Gould | 29—155.5 |
| 3,239,392 | 3/1966 | Sadler | 148—177 |
| 3,231,421 | 1/1966 | Schmidt | 117—2.2 |
| 3,116,174 | 12/1963 | Grust | 148—1.5 |
| 3,274,460 | 9/1966 | Pessock | 317—235 |
| 3,235,945 | 2/1966 | Hall | 29—155.5 |

JOHN W. HUCKERT, *Primary Examiner*.
M. EDLOW, *Assistant Examiner*.

U.S. Cl. X.R.

148—185; 317—234